(12) United States Patent
Lin

(10) Patent No.: US 9,590,560 B2
(45) Date of Patent: Mar. 7, 2017

(54) SUMMING AMPLIFIER AND METHOD THEREOF

(71) Applicant: Realtek Semiconductor Corporation, HsinChu (TW)

(72) Inventor: Chia-Liang (Leon) Lin, Fremont, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/659,676

(22) Filed: Mar. 17, 2015

(65) Prior Publication Data

US 2016/0276991 A1    Sep. 22, 2016

(51) Int. Cl.
*H03F 3/45* (2006.01)
*H03F 1/02* (2006.01)

(52) U.S. Cl.
CPC ....... *H03F 1/0205* (2013.01); *H03F 3/45183* (2013.01); *H03F 3/45659* (2013.01); *H03F 2203/45008* (2013.01); *H03F 2203/45082* (2013.01); *H03F 2203/45222* (2013.01); *H03F 2203/45418* (2013.01); *H03F 2203/45424* (2013.01)

(58) Field of Classification Search
CPC ........................................................ H03F 3/45
USPC ................................................. 330/252–261
See application file for complete search history.

(56) References Cited

U.S. PATENT DOCUMENTS 5,936,466 A * 8/1999 Andoh ................ H03F 3/45659
                                                    327/359
7,898,295 B1    3/2011 Kasturirangan et al.

OTHER PUBLICATIONS

Communication dated Aug. 22, 2016, from the Intellectual Property Office of Taiwan in counterpart application No. 104131794.

* cited by examiner

*Primary Examiner* — Khanh V Nguyen
*Assistant Examiner* — Khiem Nguyen
(74) *Attorney, Agent, or Firm* — Sughrue Mion, PLLC

(57) ABSTRACT

An apparatus includes: a first transconductance device of a first type configured to convert a first voltage into a first current of an output node; a second transconductance device of a second type configured to convert a second voltage into a second current of the output node; a common mode feedback circuit coupled to the output node configured to control a mean voltage at the output node in accordance with a reference voltage; and a reset circuit configured to reset a voltage at the output node in accordance with a clock signal.

14 Claims, 4 Drawing Sheets

SUMMING AMPLIFIER AND METHOD THEREOF

BACKGROUND

Field

The present disclosure generally relates to a summing amplifier.

Description of Related Art

Persons of ordinary skill in the art understand terms and basic concepts related to microelectronics that are used in this disclosure, such as "voltage," "current," "bias," "signal," "clock," "node," "logical signal," "trip point," "inverter," "power," "ground," "switch," "MOS (metal oxide semiconductor)," "PMOS (p-channel metal oxide semiconductor)," "NMOS (n-channel metal oxide semiconductor)," "transistor," "source," "gate," "drain," "resistor," "capacitor," "transconductance," and "common mode." Terms and basic concepts like these are apparent to those of ordinary skill in the art and thus will not be explained in detail here.

A summing amplifier receives a plurality of input signals and outputs an output signal that is a weighted sum of said plurality of input signals. A particular application of interest is a decision feedback equalizer (DFE), wherein a summing amplifier is used to equalize a signal. DFE is known to those of ordinary skill in the art of high-speed SerDes (Serializer/Deserializer) receiver and thus not described in detail here. Park et al presented a summing amplifier in "A 7 Gb/s 9.3 mW 2-Tap Current-Integrating DFE Receiver," IEEE ISSCC Dig. Tech. Papers, 2007, pp. 230-599. A shortcoming of the summing amplifier is that, the common-mode voltage of the output is difficult to control accurately. Although Park et al employed a calibration circuit to control the common-mode voltage of the output of the summing amplifier, the calibration circuit is a duplicate circuit. In other words, the calibration is performed on the duplicate circuit, instead of directly on the summing amplifier. Therefore, the accuracy of the common-mode voltage of the output of the summing amplifier is questionable and subject to a mismatch between the duplicate circuit and the summing amplifier. Another shortcoming of the summing amplifier is: the summing amplifier needs to be reset periodically, and a power supply circuit that supplies power to the summing amplifier will be disturbed whenever the summing amplifier is reset.

An exemplary embodiment of a summing amplifier has an accurate output common-mode voltage control and exhibits less disturbance to the power supply circuit.

BRIEF SUMMARY

An aspect of an exemplary embodiment is to perform a weighted sum on a plurality of voltage signals while accurately controlling a common mode voltage of an output of the weighted sum so that the common mode voltage is approximately equal to a reference voltage regardless of a state of the output.

An aspect of an exemplary embodiment is to perform a weighted sum on a plurality of voltage signals, including a first voltage signal and a second voltage signal, in a power efficient manner, wherein a bias current for processing the first voltage signal is re-used as a part of a bias current for processing the second voltage signal.

An aspect of an exemplary embodiment is to perform a weighted sum on a plurality of voltage signals in a power efficient manner while avoiding disturbance to a power supply circuit that supplies power to enable the performing of the weighted sum upon a reset of an output of the weighted sum.

In an exemplary embodiment, an apparatus comprises: a first transconductance device of a first type configured to convert a first voltage into a first current of an output node; a second transconductance device of a second type configured to convert a second voltage into a second current of the output node; a common mode feedback circuit coupled to the output node configured to control a mean voltage at the output node in accordance with a reference voltage; and a reset circuit configured to reset a voltage at the output node in accordance with a clock signal. In an exemplary embodiment, the first transconductance device of the first type comprises a pair of NMOS (n-channel metal oxide semiconductor) transistors, and the second transconductance device of the second type comprises a pair of PMOS (p-channel metal oxide semiconductor) transistors. In an exemplary embodiment, the common mode feedback circuit comprises: a pair of resistors configured to establish a sensed voltage representing the mean voltage at the output node; a MOS (metal oxide semiconductor) transistor configured to output a correction current to the output node in accordance with a feedback voltage; and an operational amplifier configured to output the feedback voltage in accordance with a difference between the reference voltage and the sensed voltage. In an exemplary embodiment, the reset circuit comprises a switch circuit comprising a NMOS transistor configured to short the output node to reset the voltage at the output node when the clock signal is asserted. In an exemplary embodiment, a voltage level of the clock signal is configured to provide a high over-drive voltage for the switch circuit when the voltage of the output node is being reset. In an exemplary embodiment, the second voltage is a logical signal representing a decision on the voltage at the output node of a previous cycle of the clock signal.

In an exemplary embodiment, a method comprises: receiving a first voltage and a second voltage; converting the first voltage into a first current of an output node using a first transconductance device of a first type; converting the second voltage into a second current of the output node using a second transconductance device of a second type; controlling a mean voltage at the output node using a common mode feedback circuit in accordance with a reference voltage; and periodically resetting the voltage at the output node in accordance with a clock signal. In an exemplary embodiment, the first transconductance device of the first type comprises a pair of NMOS (n-channel metal oxide semiconductor) transistors, and the second transconductance device of the second type comprises a pair of PMOS (p-channel metal oxide semiconductor) transistors. In an exemplary embodiment, the common mode feedback circuit comprises: a pair of resistors configured to establish a sensed voltage representing the mean voltage at the output node; a MOS (metal oxide semiconductor) transistor configured to output a correction current to the output node in accordance with a feedback voltage; and an operational amplifier configured to output the feedback voltage in accordance with a difference between the reference voltage and the sensed voltage. In an exemplary embodiment, the reset circuit comprises a switch circuit comprising a MOS (metal oxide semiconductor) transistor configured to short the output node when the clock signal is asserted. In an exemplary embodiment, a voltage level of the clock signal is configured to provide a high over-drive voltage for the switch circuit when the voltage of the output node is being reset. In an embodiment, the second voltage is a logical signal representing a decision on the voltage at the output node of a previous cycle of the clock signal.

DETAILED DESCRIPTION

Figure 1:
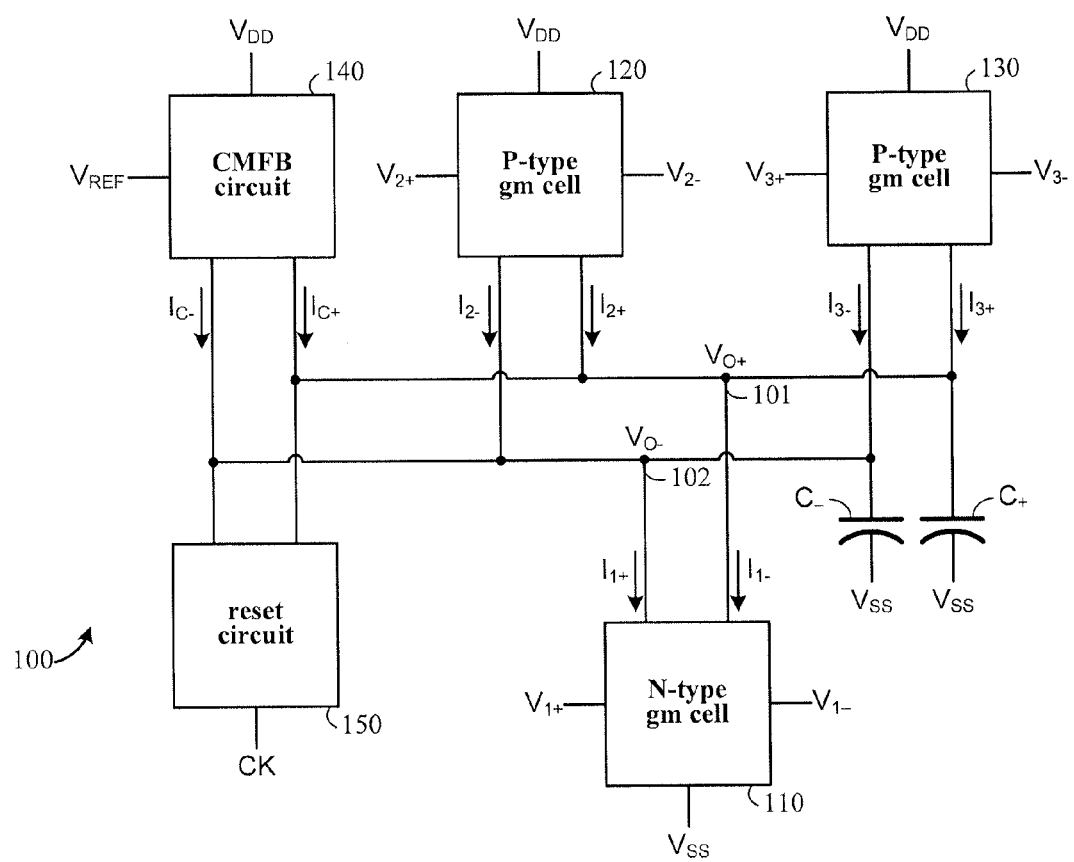
FIG. 1 shows a schematic diagram of summing amplifier in accordance with an exemplary embodiment of the present disclosure.

Apparatus and methods consistent with exemplary embodiments relate to a summing amplifier. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

In this disclosure, a logical signal is a signal of two opposite states: "high" and "low," which can also be re-phrased as "1" and "0." For brevity, when a logical signal is in the "high" ("low") state, we can simply state that the logical signal is "high" ("low"), or alternatively, the logical signal is "1" ("0"). Also, for brevity, the quotation marks may be omitted, and simply state that the logical signal is high (low), or alternatively, the logical signal is 1 (0), with the understanding that the statement is made in the context of describing a state of the logical signal. A logical signal is embodied by a voltage. The logical signal is "high" ("low") when the voltage is above (below) an associated trip point of a logical device that receives and processes the logical signal. For brevity, the associated trip point is simply referred to as the trip point of the logical signal. In this disclosure, the trip point of a first logical signal may not be necessarily the same as the trip point of a second logical signal.

A clock signal is a periodic logical signal.

If a logical signal is "high" (or "1") it is said to be "asserted." If the logical signal is "low," it is said to be "de-asserted."

If the state of a first logical signal is always opposite to the state of a second logical signal, the first logical signal is said to be a logical complement to the second logical signal. Also, as an alternate expression, the first logical signal and the second logical signal are said to be complementary.

A differential signaling is used according to an exemplary embodiment when a voltage signal comprises a first end denoted by a subscript "+" and a second end denoted by a subscript "−" and the voltage signal is equal to a difference of voltage between the first end and the second end. For instance, a voltage signal $V_1$ comprises a first end $V_{1+}$ and a second end $V_{1-}$ and the voltage signal $V_1$ is equal to $V_{1+}-V_{1-}$. For brevity, the disclosure refers to $V_1$, but it would be understood by one skilled in the art that both $V_{1+}$ and $V_{1-}$ are implicated. Likewise, according to an exemplary embodiment, a current signal comprises a first branch denoted by a subscript "+" and a second branch denoted by a subscript "−" and the current signal is equal to a difference of current between the first branch and the second branch. For instance, a current signal $I_1$ comprises a first branch $I_{1+}$ and a second branch $I_{1-}$ and the current signal $I_1$ is equal to $I_{1+}-I_{1-}$. For brevity, we sometimes simply refer to $I_1$, but it must be understood that we refer to both $I_{1+}$ and $I_{1-}$.

According to an exemplary embodiment, "$V_{DD}$" and "$V_{SS}$" denote a power supply node and a ground node, respectively. Both notations are widely used in the prior art.

According to an exemplary embodiment, a device is said to be sinking a current when the current is flowing into the device; a device is said to be sourcing a current when the current is flowing out of the device.

According to an exemplary embodiment, a gm cell is a device configured to perform a voltage-to-current conversion by receiving a voltage signal and outputting a current signal in response. A N-type gm cell is a gm cell using a NMOS transistor to perform the voltage-to-current conversion, and a P-type gm cell is a gm cell using a PMOS transistor to perform the voltage-to-current conversion. Note that "gm" is a notation widely used by one skilled in the art to denote "transconductance," which characterizes transfer characteristics of the voltage to current conversion.

FIG. 1 depicts a schematic diagram of a summing amplifier 100 in accordance with an exemplary embodiment of the present disclosure. Summing amplifier 100 comprises: a N-type gm cell 110; a first P-type gm cell 120; a second P-type gm cell 130; a CMFB (common-mode feedback) circuit 140; and a reset circuit 150.

The N-type gm cell 110 receives a first voltage signal $V_1$ (comprising $V_{1+}$ and $V_{1-}$) and sinks a first current signal $I_1$ (comprising $I_{1+}$ and $I_{1-}$). The first P-type gm cell 120 receives a second voltage signal $V_2$ (comprising $V_{2+}$ and $V_{2-}$) and sources a second current signal $I_2$ (comprising $I_{2+}$ and $I_{2-}$). The second P-type gm cell 130 receives a third voltage signal $V_3$ (comprising $V_{3+}$ and $V_{3-}$) and sources a third current signal $I_3$ (comprising $I_{3+}$ and $I_{3-}$). In an exemplary embodiment, $V_1$, $V_2$, $V_3$, $I_1$, $I_2$, and $I_3$ are all differential signals and each of them comprises a first end (denoted by "+") and a second end (denoted by "−"). The first current signal $I_1$ is sunk from a first node 101 and a second node 102. Components of the second current signal $I_2$ and the third current signal $I_3$ are respectively sourced to the first node 101 and the second node 102. The CMFB circuit 140 is controlled by a reference voltage $V_{REF}$ and coupled to the first node 101 and the second node 102. The reset circuit 150 is coupled to the first node 101 and the second node 102 and controlled by a clock signal CK. Summing amplifier 100 further comprises a first capacitor $C_+$ and a second capacitor $C_-$ to represent a total capacitive load at the first node 101 and the second node 102, respectively. N-type gm cell 110, the first P-type gm cell 120, and the second P-type gm cell 130 convert the first voltage signal $V_1$, the second voltage signal $V_2$, and the third voltage signal $V_3$ into the first current signal $I_1$, the second current signal $I_2$, and the third current signal $I_3$, respectively. The first current signal $I_1$, the second current signal $I_2$, and the third current signal $I_3$ are effectively summed at the first node 101 and the second node 102 and integrated by the first capacitor $C_+$ and the second capacitor $C_-$.

In an exemplary embodiment, summing amplifier 100 is a balanced circuit, so that a total capacitance at the first node 101 is equal to a total capacitance at the second node 102 (including contributions from parasitic capacitors). Let the total capacitance be $C_L$, both at the first node 101 and at the second node 102. Mathematically, the output voltage signal $V_O$ is defined by a difference between the first end $V_{O+}$ (which is a voltage at the first node 101) and the second end $V_{O-}$ (which is a voltage at the second node 102). The first end $V_{O+}$ is an integration of a net current flowing into the first node 101 divided by the total capacitance $C_L$ at the first node 101. The second end $V_{O-}$ is an integration of a net current flowing into the second node 102 divided by the total capacitance $C_L$ at the second node 102. Therefore, we can write $$V_{o+}(t) = \frac{1}{C_L}\int_0^t (I_{2+}(\tau) + I_{3+}(\tau) - I_{1-}(\tau))d\tau, \quad (1)$$

$$V_{o-}(t) = \frac{1}{C_L}\int_0^t (I_{2-}(\tau) + I_{3-}(\tau) - I_{1+}(\tau))d\tau, \quad (2)$$

and since $V_O(t) \equiv V_{O+}(t) - V_{O-}(t)$ we can write $$V_o(t) = \frac{1}{C_L}\int_0^t ((I_{2+}(\tau) + I_{3+}(\tau) - I_{1-}(\tau)) - (I_{2-}(\tau) + I_{3-}(\tau) + I_{1+}(\tau)))d\tau \quad (3)$$

Here, $(I_{2+}(\tau) + I_{3+}(\tau) - I_{1-}(\tau))$ is the net current flowing into the first node 101, while $(I_{2-}(\tau) + I_{3-}(\tau) - I_{1+}(\tau))$ is the net current flowing into the second node 102. Using the definition $I_i \equiv I_{i+} - I_{i-}$, for i=1, 2, 3, we can re-write Equation (3) as $$V_o(t) = \frac{1}{C_L}\int_0^t (I_1(\tau) + I_2(\tau) + I_3(\tau))d\tau \quad (4)$$

Let the transconductance of the N-type gm cell 110, the first P-type gm cell 120, and the second P-type gm cell 130 be $g_{m1}$, $g_{m2}$, and $g_{m3}$, respectively. Using the definitions $V_i \equiv V_{i+} - V_{i-}$ and $g_{mi} \equiv I_i/V_i$ for i=1, 2, 3, we can rewrite Equation (4) as $$V_o(t) = \frac{1}{C_L}\int_0^t (g_{m1}V_1(\tau) + g_{m2}V_2(\tau) + g_{m3}V_3(\tau))d\tau \quad (5)$$

Therefore, summing amplifier 100 effectively performs a weighted sum of the first voltage signal $V_1$, the second voltage signal $V_2$, and the third voltage signal $V_3$.

A mean value of the first end $V_{O+}$ and the second end $V_{O-}$ of the output voltage $V_O$ is referred to as a common mode of the output voltage $V_O$ and is denoted as $V_{OCM}$, that is $$V_{OCM} \equiv (V_{O+} + V_{O-})/2 \quad (6)$$

CMFB circuit 140 is used to output a first correction current $I_{C+}$ and a second correction current $I_{C-}$ to the first node 101 and the second node 102 to adjust the first end $V_{O+}$ and the second end $V_{O-}$ respectively, so that $V_{OCM}$, the common mode of the output voltage $V_O$, is approximately equal to the reference voltage $V_{REF}$.

Reset circuit 150 is used to periodically reset the output voltage $V_O$. Upon assertion of the clock signal CK, the first node 101 and the second node 102 are shorted, so that the first end $V_{O+}$ and the second end $V_{O-}$ are equalized and the output voltage $V_O$ is thus reset to zero. This is needed for applications such as aforementioned DFE.

Figure 2:
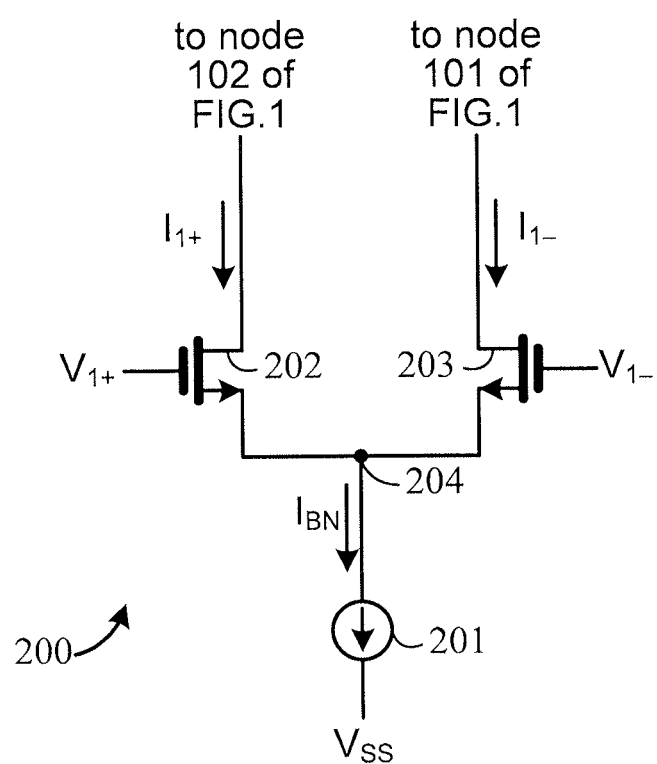
FIG. 2 shows a schematic diagram of a N-type gm cell.

FIG. 2 depicts a schematic diagram of a N-type gm cell 200 according to an exemplary embodiment for embodying the N-type gm cell 110 of FIG. 1. N-type gm cell 200 comprises: a first NMOS transistor 202, a second NMOS transistor 203, and a current sink 201. Current sink 201 sinks a bias current $I_{BN}$ from an internal node 204. The first NMOS transistor 202 has three terminals: source, gate, and drain, coupled to the internal node 204, the first end $V_{1+}$ (of the first voltage $V_1$), and node 102 of FIG. 1, respectively. The second NMOS transistor 203 has three terminals: source, gate, and drain, coupled to the internal node 204, the second end $V_{1-}$ (of the first voltage $V_1$) and node 101 of FIG. 1, respectively. N-type gm cell 200 is self-explanatory to those of ordinary skill in the art and thus not described in detail here.

Figure 3:
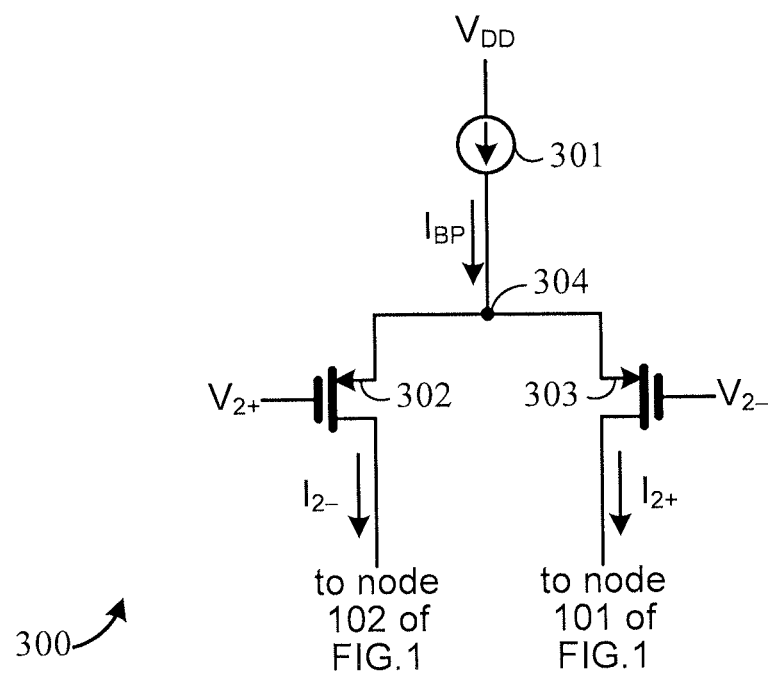
FIG. 3 shows a schematic diagram of a P-type gm cell.

FIG. 3 depicts a schematic diagram of a P-type gm cell 300 in accordance with an embodiment of the present disclosure according to an exemplary embodiment for embodying the first P-type gm cell 120 of FIG. 1. P-type gm cell 300 comprises: a first PMOS transistor 302, a second PMOS transistor 303, and a current source 301. Current source 301 sources a bias current $I_{BP}$ to an internal node 304. The first PMOS transistor 302 has three terminals: source, gate, and drain, coupled to the internal node 304, the first end $V_{2+}$ (of the second voltage $V_2$), and node 102 of FIG. 1, respectively. The second PMOS transistor 303 has three terminals: source, gate, and drain, coupled to the internal node 304, the second end $V_{2-}$ (of the second voltage $V_2$), and node 101 of FIG. 1, respectively. P-type gm cell 300 is self-explanatory to those of ordinary skill in the art and thus not described in detail here.

The same circuit of P-type gm cell 300 of FIG. 3 can be used to embody the second P-type gm cell 130 of FIG. 1 by simply replacing $V_{2+}$, $V_{2-}$, $I_{2+}$, and $I_{2-}$ with $V_{3+}$, $V_{3-}$, $I_{3+}$, and $I_{3-}$, respectively.

Although the same circuit of P-type gm cell 300 of FIG. 3 can embody both the first P-type gm cell 120 and the second P-type gm cell 130 of FIG. 1, it must be understood that the first P-type gm cell 120 and the second P-type gm cell 130 of FIG. 1 are two separate circuits that can be implemented and configured differently at the discretion of circuit designers.

Figure 4:
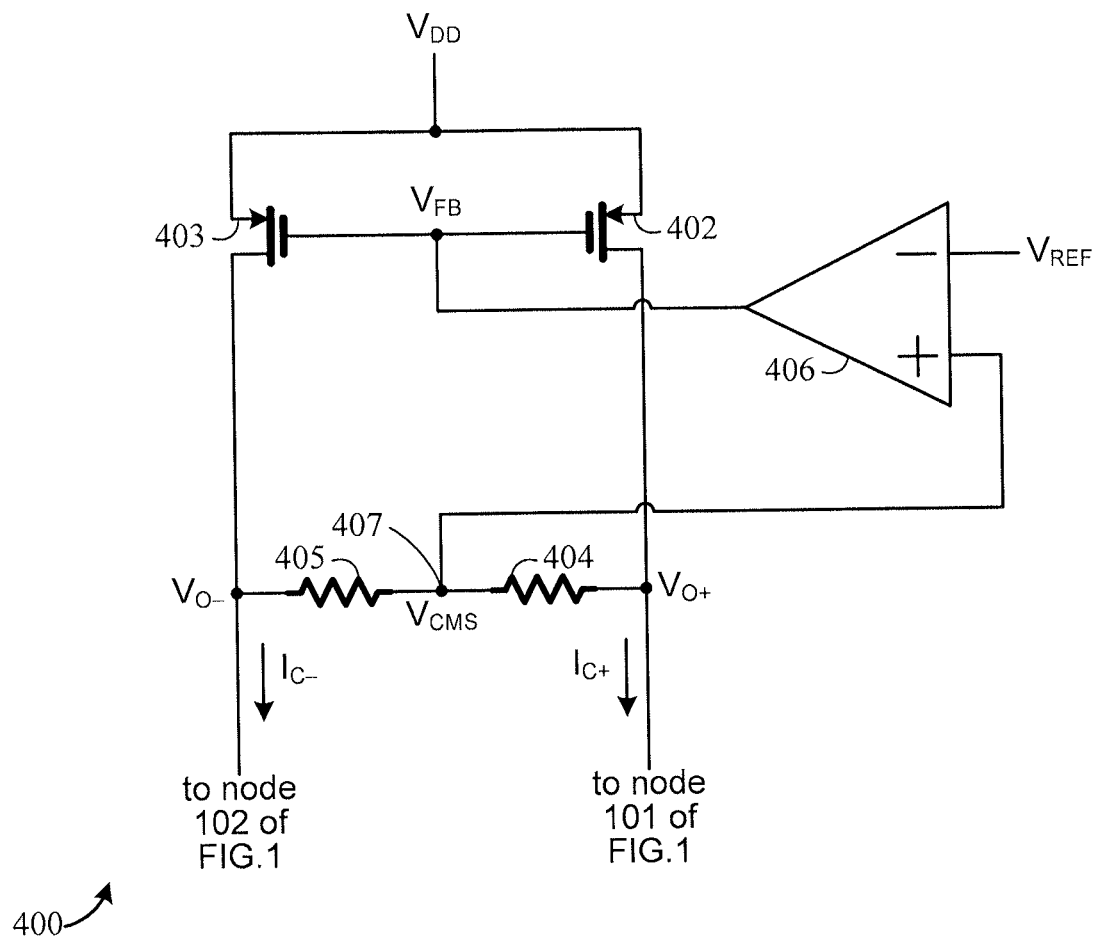
FIG. 4 shows a schematic diagram of a common mode feedback circuit.

FIG. 4 depicts a schematic diagram of a CMFB circuit 400 suitable for embodying CMFB circuit 140 of FIG. 1. CMFB circuit 400 comprises a first PMOS transistor 402, a second PMOS transistor 403, a first resistor 404, a second resistor 405, and an operational amplifier 406. The first PMOS transistor 402 has three terminals: source, gate, and drain, coupled to the power supply node $V_{DD}$, a feedback voltage $V_{FB}$, and node 101 of FIG. 1, respectively. The second PMOS transistor 403 has three terminals: source, gate, and drain, coupled to the power supply node $V_{DD}$, the feedback voltage $V_{FB}$, and node 102 of FIG. 1, respectively. The first resistor 404 and the second resistor 405 are substantially identical and are configured to be serially connected and placed between node 101 and node 102 of FIG. 1 to form a common-mode level sensing network, such that a sensed common-mode voltage $V_{CMS}$ at the junction node 407 between the first resistor 404 and the second resistor 405 is approximately equal to a mean value of $V_{O+}$ (which is the voltage at node 101 of FIG. 1) and $V_{O-}$ (which is the voltage at node 102 of FIG. 1). Note that sensed common-mode voltage $V_{CMS}$ is approximately equal to $V_{OCM}$ defined in Equation (6), as long as the two resistors 404 and 405 are substantially identical. Operational amplifier 406 outputs the feedback voltage $V_{FB}$ in accordance with a difference between the reference voltage $V_{REF}$ and the sensed common-mode voltage $V_{CMS}$. If the sensed common-mode voltage $V_{CMS}$ is too high (low), as compared to the reference voltage $V_{REF}$, the operational amplifier 406 will raise (lower) a level of the feedback voltage $V_{FB}$ to decrease (increase) the first correction current $I_{C+}$ and the second correction current $I_{C-}$ to lower (raise) the voltages at node 101 and node 102 via the first PMOS transistor 402 and the second PMOS transistor 403, respectively. The mean value of $V_{O+}$ and $V_{O-}$ is thus controlled in a closed-loop manner to be approximately equal to the reference voltage $V_{REF}$. The common mode voltage of the output voltage $V_O$ of FIG. 1 is thus controlled to match the reference voltage $V_{REF}$.

Operational amplifier is well known to those of ordinary skill in the art and thus not described in detail here.

Figure 5:
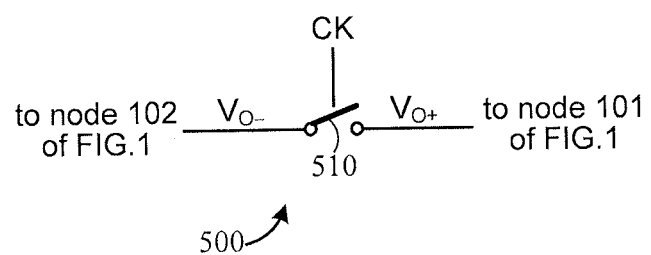
FIG. 5 shows a schematic diagram of a reset circuit.

FIG. 5 depicts a reset circuit 500 according to an exemplary embodiment for embodying the reset circuit 150 of FIG. 1. Reset circuit 500 comprises a switch 510 controlled by the clock signal CK. Upon assertion of the clock signal CK, the switch 510 is turned on, the first node 101 and the second 102 of FIG. 1 are shorted, and therefore the output voltage $V_O$ is reset to zero.

In an exemplary embodiment, the switch 510 of FIG. 5 is embodied by a NMOS transistor. By way of example but not limitation, in an embodiment: the voltage at the power supply node $V_{DD}$ is 1V; the voltage at the ground node $V_{SS}$ is 0V; the reference voltage $V_{REF}$ is 0.5V; the clock signal CK is 1.5V when it's asserted and 0.5V when it's de-asserted. In an exemplary embodiment, the switch 510 of FIG. 5 is easier to turn on due to using a clock signal that provides a higher over-drive voltage when the switch 510 needs to be turned on, compared to in an another case where the clock signal CK is 1V when it's asserted and 0V when it's de-asserted.

In another exemplary embodiment, the switch 510 of FIG. 5 is embodied by a PMOS transistor. By way of example but not limitation, in an embodiment: the voltage at the power supply node $V_{DD}$ is 1V; the voltage at the ground node $V_{SS}$ is 0V; the reference voltage $V_{REF}$ is 0.5V; the clock signal CK is 0.5V when it's asserted and −0.5V when it's de-asserted. Note that when using the PMOS transistor to embody the switch 510, the switch 510 is turned on when the clock signal CK is de-asserted (instead of asserted). In this particular embodiment, the switch 510 of FIG. 5 is easier to turn on due to using a clock signal that provides a higher over-drive voltage when the switch 510 needs to be turned on, compared to in an another case where the clock signal CK is 1V when it's asserted and 0V when it's de-asserted.

In any embodiment, it is advantageous to adjust the two levels ("high" and "low") of the clock signal CK so that the switch 510 of FIG. 5 receives a high over-drive voltage when it is being turned on.

Referring back to FIG. 1, a summing amplifier 100 consistent with exemplary embodiments offers a few advantages over the prior art summing amplifier presented in the aforementioned paper by Park. First, the common mode of the output voltage $V_O$ can be well controlled through the CFMB circuit 140. Second, among the voltage signals to be summed, a first component (e.g., $V_1$) is summed via a N-type gm cell, while a second component (e.g., $V_2$ and $V_3$) is summed via a P-type gm cell. Therefore, a bias current within the P-type gm cell (e.g., $I_{BP}$ of FIG. 3) can be effectively re-used by the N-type gm cell as a part of a bias current therein (e.g., $I_{BN}$ of FIG. 2), because a DC current sourced from the P-type gem cell has to be sunk by the N-type gm cell. In other words, the power consumed to bias the P-type gm cell also serves to bias the N-type gm cell. The summing amplifier 100, therefore, is inherently more power efficient than the prior art summing amplifier wherein all voltage signals are summed via N-type gm cells. Third, the output voltage $V_O$ is reset by shorting the first node 101 and the second node 102 to equalize the first end $V_{O+}$ and the second end $V_{O-}$. The resetting does not affect the common mode of the output voltage $V_O$, and therefore does not disturb the power supply circuit (not shown in FIG. 1) that supplies power to the summing amplifier 100 via the power supply node $V_{DD}$. In contrast, in the prior art summing amplifier, the output voltage is reset by shorting both the first end and the second end to the power supply node, and therefore the power supply circuit is disturbed every time the resetting takes place.

In an exemplary embodiment, summing amplifier 100 is part of a DFE (decision feedback equalizer) circuit. In this case, $V_{2+}$ (which is the first end of the second voltage signal $V_2$) is a first logical signal representing a decision on the output voltage $V_O$ of a previous clock cycle of the clock signal CK, and $V_{2-}$ (which the second end of the second voltage signal $V_2$) is a logical complement to $V_{2+}$. Also, $V_{3+}$ (which is the first end of the third voltage signal $V_3$) is a second logical signal representing a previous state of $V_{2+}$ of a previous clock cycle of the clock signal CK, and $V_{3-}$ (which the second end of the third voltage signal $V_3$) is a logical complement to $V_{3+}$. As far as the function of a decision feedback equalization is concerned, the first P-type gm cell 120 is configured to cancel a first post-cursor inter-symbol interference, while the second P-type gm cell 130 is configured to cancel a second post-cursor inter-symbol interference. Here, a decision on the output voltage $V_O$ indicates a polarity of the output voltage $V_O$. For instance, the decision is 1 if $V_O$ is positive, and 0 otherwise.

Those of ordinary skill in the art understand that, an original circuit can be replaced by an alternative circuit that is a "flipped" version of the original circuit, while retaining the functions of the original circuit. For the case where the summing amplifier 100 of FIG. 1 is the original circuit, the alternative circuit can be constructed by: replacing each NMOS transistor in the original circuit with a PMOS transistor, replacing each PMOS transistor in the original circuit with a NMOS transistor, replacing each current source in the original circuit with a current sink, replacing each current sink in the original circuit with a current source, replacing the power supply node $V_{DD}$ in the original circuit with the ground node $V_{SS}$, and replacing the ground node $V_{SS}$ in the original circuit with the power supply node $V_{DD}$.

Those skilled in the art will readily observe that numerous modifications and alterations of the device and method may be made while retaining spirit of the exemplary embodiments. Accordingly, the above disclosure should not be construed as limiting the invention. The scope of invention is as set forth in the appended claims and their equivalents.

What is claimed is:

1. An apparatus comprising:
    a first transconductance device of a first type configured to convert a first voltage into a first current of an output node;
    a second transconductance device of a second type configured to convert a second voltage into a second current of the output node;
    a common mode feedback circuit coupled to the output node configured to control a mean voltage at the output node in accordance with a reference voltage; and
    a reset circuit configured to reset a voltage at the output node in accordance with a clock signal, wherein the clock signal is a periodic logic signal.

2. The apparatus of claim 1, wherein the first transconductance device of the first type comprises a pair of NMOS (n-channel metal oxide semiconductor) transistors, and the second transconductance device of the second type comprises a pair of PMOS (p-channel metal oxide semiconductor) transistors.

3. The apparatus of claim 1, wherein the common mode feedback circuit comprises: a pair of resistors configured to establish a sensed voltage representing the mean voltage at the output node; a MOS (metal oxide semiconductor) transistor configured to output a correction current to the output node in accordance with a feedback voltage; and an operational amplifier configured to output the feedback voltage in accordance with a difference between the reference voltage and the sensed voltage.

4. The apparatus of claim 1, wherein the reset circuit comprises a switch circuit comprising a NMOS (n-channel metal oxide semiconductor) transistor configured to short the voltage at the output node when the clock signal is asserted.

5. The apparatus of claim 4, wherein a voltage level of the clock signal is configured to provide a high over-drive voltage for the switch circuit when the voltage of the output node is being reset.

6. The apparatus of claim 1, wherein the second voltage is a logical signal representing a decision on the voltage at the output node of a previous cycle of the clock signal.

7. A method comprising:
receiving a first voltage and a second voltage;
converting the first voltage into a first current of an output node using a first transconductance device of a first type;
converting the second voltage into a second current of the output node using a second transconductance device of a second type;
controlling a mean voltage at the output node using a common mode feedback circuit in accordance with a reference voltage; and
periodically resetting the voltage at the output node in accordance with a clock signal, wherein the clock signal is a periodic logic signal.

8. The method of claim 7, wherein the first transconductance device of the first type comprises a pair of NMOS (n-channel metal oxide semiconductor) transistors, and the second transconductance device of the second type comprises a pair of PMOS (p-channel metal oxide semiconductor) transistors.

9. The method of claim 7, wherein the common mode feedback circuit comprises: a pair of resistors configured to establish a sensed voltage representing the mean voltage at the output node; a MOS (metal oxide semiconductor) transistors configured to output a correction current to the output node in accordance with a feedback voltage; and an operational amplifier configured to output the feedback voltage in accordance with a difference between the reference voltage and the sensed voltage.

10. The method of claim 7, wherein the reset circuit comprises a switch circuit comprising a MOS (metal-oxide semiconductor) transistor configured to short the output node when the clock signal is asserted.

11. The method of claim 10, a voltage level of the clock signal is configured to provide a high over-drive voltage for the switch circuit when the voltage of the output node is being reset.

12. The method of claim 7, wherein the second voltage is a logical signal representing a decision on the voltage at the output node of a previous cycle of the clock signal.

13. The apparatus of claim 1, wherein the first voltage and the second voltage are different voltage signals.

14. The method of claim 7, wherein the first voltage and the second voltage are different voltage signals.

* * * * *